(12) United States Patent
Okamura

(10) Patent No.: US 8,101,847 B2
(45) Date of Patent: Jan. 24, 2012

(54) THERMOELECTRIC MODULE

(75) Inventor: Takeshi Okamura, Kokubu (JP)

(73) Assignee: KYOCERA Corporation, Kyoto (JP)

( * ) Notice: Subject to any disclaimer, the term of this patent is extended or adjusted under 35 U.S.C. 154(b) by 388 days.

(21) Appl. No.: 12/360,506

(22) Filed: Jan. 27, 2009

(65) Prior Publication Data
US 2010/0031986 A1    Feb. 11, 2010

(30) Foreign Application Priority Data

Jan. 29, 2008  (JP) ................................. 2008-018210
Jan. 9, 2009   (JP) ................................. 2009-003066

(51) Int. Cl.
*H01L 35/00* (2006.01)
*H01L 35/30* (2006.01)
*H01L 35/28* (2006.01)
*H01L 21/00* (2006.01)
*F25B 21/02* (2006.01)

(52) U.S. Cl. ........ 136/200; 136/205; 136/211; 136/212; 62/3.2; 438/125

(58) Field of Classification Search ........................ None
See application file for complete search history.

(56) References Cited

U.S. PATENT DOCUMENTS

| 6,274,803 B1 * | 8/2001 | Yoshioka et al. ............. 136/201 |
| 7,589,417 B2 * | 9/2009 | Ramanathan et al. ........ 257/713 |
| 2002/0121094 A1 * | 9/2002 | VanHoudt ........................ 62/3.3 |
| 2006/0168969 A1 * | 8/2006 | Mei et al. ......................... 62/3.7 |
| 2007/0227158 A1 * | 10/2007 | Kuchimachi ..................... 62/3.7 |

FOREIGN PATENT DOCUMENTS

JP       2001-119076       4/2001

* cited by examiner

*Primary Examiner* — Jennifer K. Michener
*Assistant Examiner* — Christopher Danicic
(74) *Attorney, Agent, or Firm* — Procopio, Cory, Hargreaves & Savitch LLP

(57) ABSTRACT

A thermoelectric module includes a first substrate, a second substrate having a second surface which is apart from and faces a first surface of the first substrate, a plurality of thermoelectric elements arranged on the first and the second surfaces, a plurality of electrodes on the first and second surfaces each electrically connected to at least one of the plurality of thermoelectric elements, and a ground electrode on at least the first surface. The plurality of electrodes on at least the first surface comprises a plurality of columns each of which comprises two or more electrodes aligned in a longitudinal direction, and the ground electrode is between two adjacent columns among the plurality of columns.

16 Claims, 8 Drawing Sheets

THERMOELECTRIC MODULE

RELATED APPLICATION

The present application claims priority under 35 U.S.C. §119 to Japanese Patent Application No. 2008-018210, filed Jan. 29, 2008 and Japanese Patent Application No. 2009-003066 filed Jan. 9, 2009, and the contents of each of these applications is incorporated herein by reference in its entirety.

BACKGROUND

1. Field of the Invention

The present invention relates to a thermoelectric module, and more particularly, to a thermoelectric module which is used in temperature control of, for example, an air conditioner, a cooling/warming device, a semiconductor manufacturing apparatus, a photo detection apparatus, or a laser diode.

2. Related Art

A conventional thermoelectric module is disclosed, for example, in Japanese Patent Application Laid-Open No. 2001-119076. Of late, in a thermoelectric module miniaturization is required together with a high thermoelectric characteristic.

SUMMARY

In one embodiment, a thermoelectric module includes, a first substrate; a second substrate comprising a second surface which is apart from and faces a first surface of the first substrate, a plurality of thermoelectric elements arranged on the first surface and the second surface, a plurality of electrodes on the first surface and second surface electrically connected to at least one of the plurality of thermoelectric elements, and at least one ground electrode on at least the first surface. At least a majority of the electrodes on at least the first surface are arranged in a plurality of columns which each comprise at least two or more electrodes aligned in a longitudinal direction, and the ground electrode is located between two adjacent columns.

In one embodiment, at least some of the electrodes on both surfaces are aligned in a plurality of columns each of which comprises two or more electrodes. A ground electrode may be provided on both surfaces to extend in a longitudinal direction between an adjacent pair of columns.

BRIEF DESCRIPTION OF THE DRAWINGS

The present disclosure, in accordance with one or more embodiments, is described in detail with reference to the following figures. The drawings are provided for purposes of illustration only and merely depict typical or exemplary embodiments of the disclosure. These drawings are provided to facilitate the reader's understanding of the disclosure and shall not be considered limiting of the breadth, scope, or applicability of the disclosure. It should be noted that for clarity and ease of illustration these drawings are not necessarily made to scale.

DETAILED DESCRIPTION

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present invention.

Figure 1:
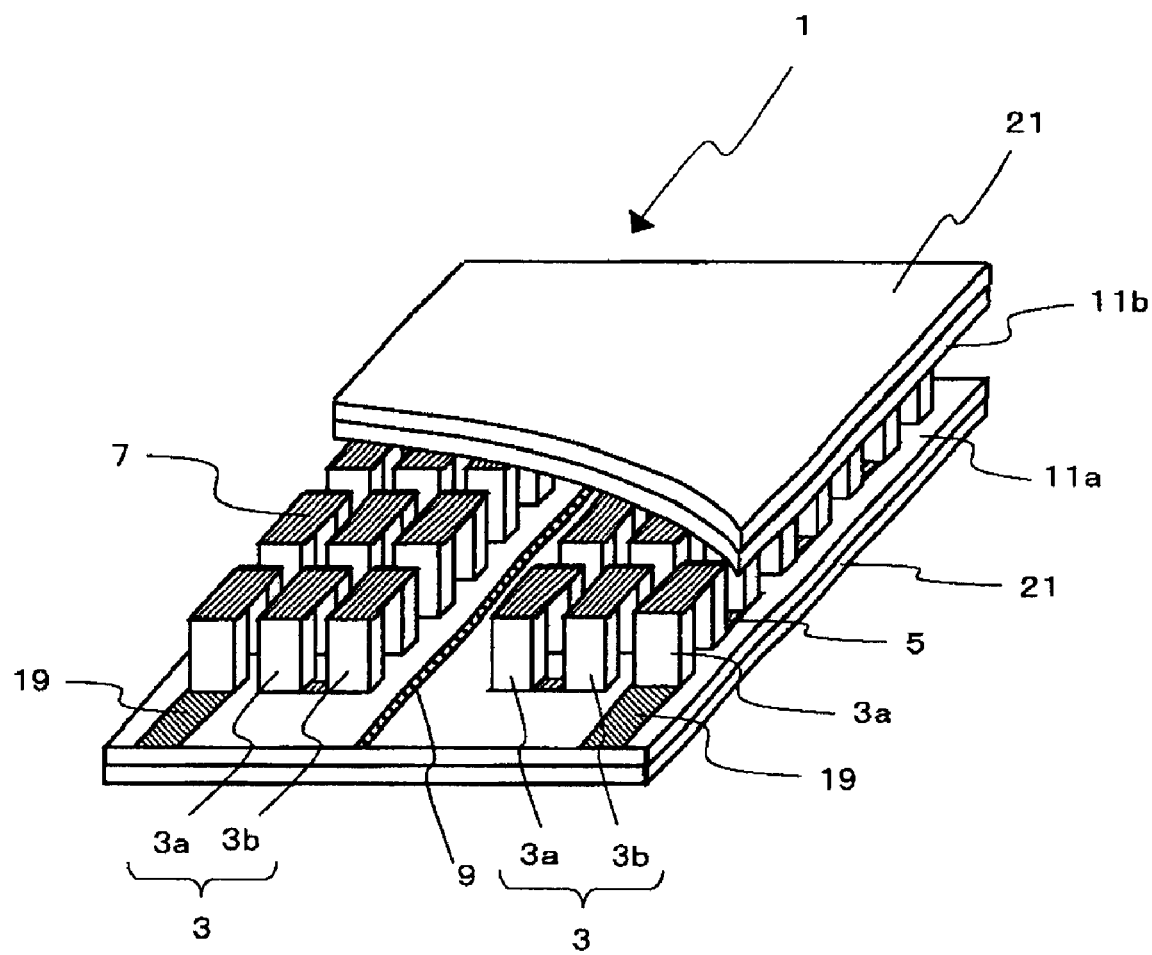
FIG. 1 is a partial cutaway perspective view illustrating a thermoelectric module according to a first embodiment.
Figure 2:
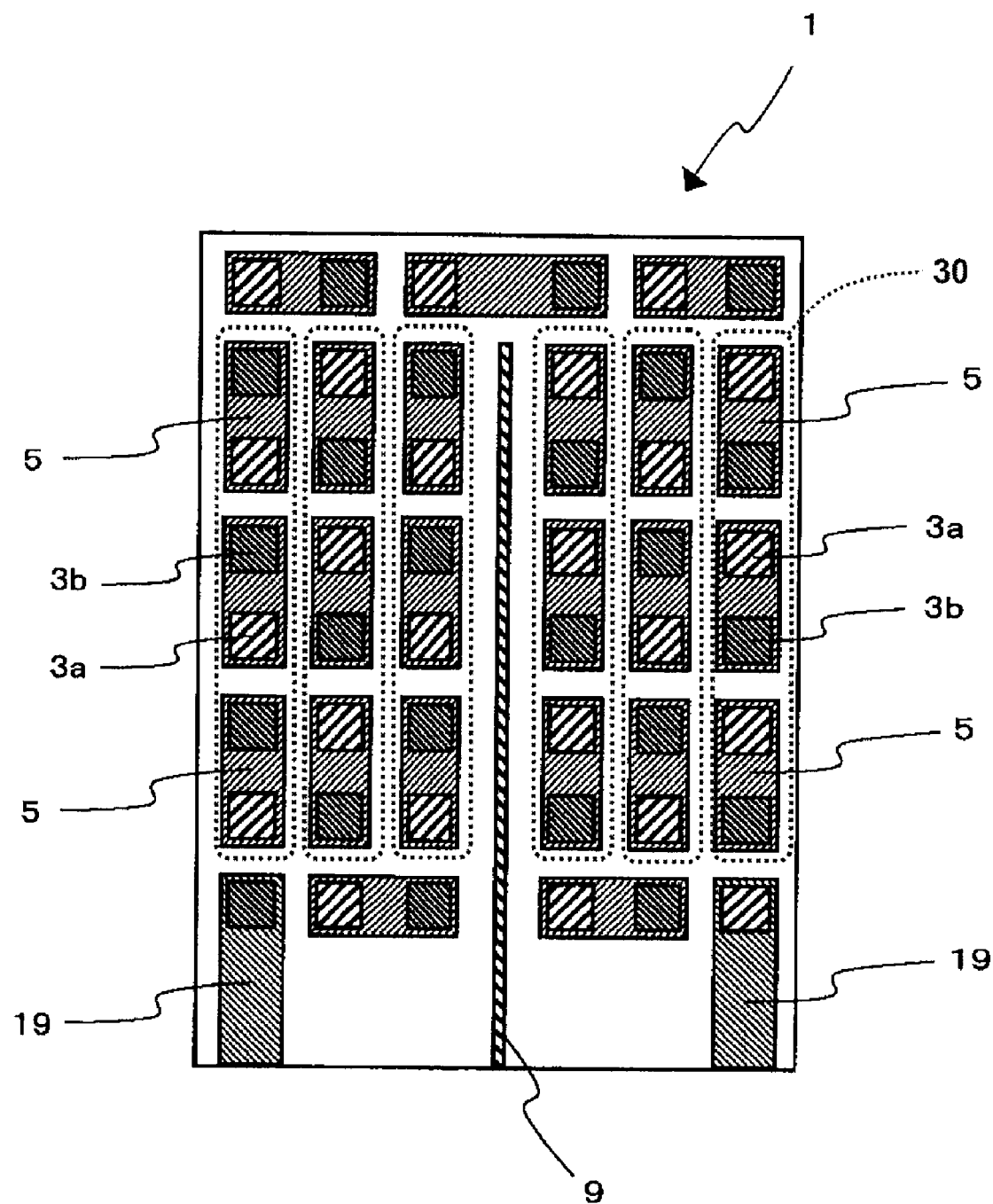
FIG. 2 is a cross-sectional view parallel to a base body surface of the thermoelectric module of FIG. 1.

FIGS. 1 and 2 show a thermoelectric module according to a first embodiment.

A thermoelectric module 1 of the first embodiment includes a plurality of thermoelectric elements 3 which are interposed between opposing first and second surfaces of a pair of base bodies 11a and 11b (first substrate 11a and second substrate 11b), respectively. A plurality of rectangular first electrodes 5 are formed on the first surface of the first substrate 11a and a plurality of rectangular second electrodes 7 are formed on a second surface of the second substrate 11b facing the first surface. The first and second electrodes are electrically serially connected to a plurality of thermoelectric elements 3. Most of the electrodes 5 and 7 are aligned in a series of columns 30. Each column 30 comprises two or more electrodes aligned in a longitudinal direction, and an elongate ground electrode 9 is formed in a direction of the column 30 on the opposing surfaces of each of the base bodies 11a and 11b between a pair of adjacent columns 30. Transversely extending electrodes at the ends of adjacent pairs of columns provide connection from one column to the next, as seen in FIG. 2. Each thermoelectric element is electrically connected to a respective first electrode 5 at one end, and a respective second electrode 7 at the other end, and the electrodes are arranged to connect the thermoelectric elements in series, as explained in more detail below.

Thermoelectric Element 3

In the present embodiment, the thermoelectric element 3 comprises both P-type thermoelectric elements 3a having a positive electromotive force and N-type thermoelectric elements 3b having a negative electromotive force. The P-type thermoelectric elements 3a and the N-type thermoelectric elements 3b are alternately disposed, as best seen in FIG. 2, and are electrically serially connected by the first electrodes 5 and the second electrodes 7, with each thermoelectric element connected at one end to a respective first electrode 5 and at the other end to a respective second electrode 7.

In one embodiment, the thermoelectric element 3 is made of a material having a high thermoelectric characteristic, and may be made of an alloy including two or more kinds of elements selected from a group consisting of Bi, Sb, Te, and Se.

The plurality of thermoelectric elements 3 disposed in the thermoelectric module 1 is electrically connected to an external power source through an extraction electrode 19.

Base Body 11a

The first electrodes 5 and the ground electrode 9 are fixed to the surface of the base body 11a. Since an interval of the first electrode 5 and the ground electrode 9 is fixed, the possibility that a leakage current or an electric discharge occurs can be reduced.

The base body 11a may be made of an insulating material such as, for example, alumina ceramics, aluminum nitride ceramics, glass ceramics, and heat resistant plastic. In one embodiment, the base body 11a may be made of a material which is inexpensive and has a similar thermal expansion coefficient to the thermoelectric element 3, for example, alumina ceramics which have alumina as a main component.

In the base body 11a, a heat conducting member 21 may be disposed on an opposite surface to the first surface onto which the first electrodes 5 and the ground electrode 9 are fixed. Since heat generation or heat absorption can be effectively performed, thermoelectric efficiency can be improved. The heat conducting member 21 may be made of a material having higher heat conductivity than the base body 11a and can be made of, for example, low-resistance metal such as Cu and Al. Particularly, the heat conducting member 21 may be made of the same material as the first electrodes 5. In this case, since both electrodes 5 and heat conducting member 21 have the same thermal expansion coefficient it is possible to prevent or reduce stress from being concentrated on a bonding surface of the first electrode 5 and the base body 11a and a bonding surface of the heat conducting member 21 and the base body 11a.

Ground Electrode 9

As described above, the ground electrode 9 is disposed on the surface of the first substrate 11a.

Since the ground electrode 9 is electrically grounded, a potential difference between the ground electrode 9 and the first electrodes 5 is larger than a potential difference between adjacent first electrodes 5. Therefore, a possibility that a short circuit occurs between the adjacent first electrodes 5 can be decreased. Consequently, the spacing between the thermoelectric elements 3 which are respectively connected with the adjacent first electrodes 5 can be decreased, allowing the thermoelectric module 1 to be miniaturized without substantially deteriorating thermoelectric conversion efficiency. Therefore, for example, even under a usage environment in which condensation is generated between the thermoelectric elements 3 due to cooling, it is possible to reduce the risk of an electrical short circuit due to condensation from occurring between the thermoelectric elements 3, since a leakage current flows to the ground electrode 9.

The ground electrode 9 may be made of a material having high conductivity such as, for example, Cu and Al. In one embodiment, the ground electrode 9 is made of a material having higher thermal conductivity than the base bodies 11a and 11b. This allows variation of heat distribution of the base bodies 11a and 11b to be decreased since heat can be conducted by the ground electrode 9 used as a medium.

The ground electrode 9 may have the same composition as the first electrode 5. The ground electrode 9 is electrically connected with the thermoelectric element 3 of the thermoelectric module 1, and so one side end of the thermoelectric element 3 generates heat, and another side end thereof absorbs heat. As a result, the base body 11a to which the first electrodes 5 are fixed functions as a heat generating portion or a heat absorbing portion, and so the ground electrode 9 and the first electrode 5 expand or contract. At this time, if the ground electrode 9 and the first electrode 5 are the same in composition and thermal expansion coefficient, a variation of stress occurring between the ground electrode 9 and the first electrode 5 can be suppressed or reduced.

In one embodiment, an energizing direction of the ground electrode 9 is parallel to that of the first electrodes 5 adjacent to the ground electrode 9. The risk of an electrical short circuit occurring between the adjacent first electrodes 5 can be reduced or avoided, since a circuit type of the thermoelectric module 1 is a direct current (DC) circuit and the ground electrode 9 is located parallel to the circuit of the thermoelectric module 1. A configuration in which the ground electrode 9 is disposed parallel to the circuit of the thermoelectric module 1 can be applied to a thermoelectric module 1 used for cooling of a high-frequency circuit, particularity of a modulator. In this configuration, it is possible to prevent or reduce the risk of a high-frequency component generated in a high-frequency circuit, particularly in a modulator, from being added to the circuit of the thermoelectric module 1 as a noise signal. Accordingly, thermoelectric performance of the thermoelectric module 1 can be improved.

The distance between the adjacent thermoelectric elements 3 may be smaller than the distance between the adjacent first electrodes 5. In this case, when the ground electrode 9 is disposed between the thermoelectric elements 3, an electrical short circuit occurring between the thermoelectric elements 3 can be suppressed. For example, the thermoelectric element 3 may have a fusiform shape or a spherical shape, so that the width of an end portion of the thermoelectric element 3 with respect to a vertical direction to the surfaces of the base bodies 11a and 11b is smaller than the width of a central portion of the thermoelectric element 3.

Base Body 11b

As shown in FIGS. 1 and 2, the thermoelectric module 1 includes the base body 11b, and second electrodes 7 are fixed to the second surface of the base body 11b. As a result, since the thermoelectric element 3, the first and second electrodes 7 are held by the base bodies 11a and 11b, the shape of the thermoelectric module 1 can be stably maintained.

Similarly to the base body 11a, the ground electrode 9 may be disposed on the second surface of the base body 11b to which the second electrode 7 is fixed. In this instance, since the ground electrode 9 is disposed on each surface of the base bodies 11a and 11b, even if the circuit type of the thermoelectric module 1 is a three-dimensional circuit, an electrical short circuit can be suppressed.

The ground electrode 9 disposed on the surface of the base body 11b can be electrically connected with the ground electrode 9 disposed on the surface of the base body 11a using a conductor. Even if a leakage current flows to one ground electrode 9, a leakage current can be dispersed to the other ground electrode 9, thereby durability of the ground electrode 9 can be improved. The ground electrode 9 which is disposed on each surface of the base bodies 11a and 11b may be held by the conductor. An electrical short circuit occurring in a three-dimensional circuit can be further suppressed since the ground electrode 9 can be more stably fixed.

In one embodiment, similarly to the base body 11a, a heat conducting member 21 is disposed on an opposite surface to the surface of the base body 11b to which the second electrode 7 is fixed.

First and Second Electrodes 5 and 7

As described above, the first electrodes 5 are disposed on the surface of the base body 11a, and the second electrodes 7 are disposed on the surface of the base body 11b.

The first and second electrodes 5 and 7 may be made of a low-resistance metal such as, for example, Cu and Al. In order to improve wettability when bonding with the thermoelectric element 3 with a bonding agent while avoiding corrosion, the first electrode 5 and the second electrode 7 may be subject to plate processing such as Ni plating or Au plating.

The shape of the first and second electrodes 5 and 7 is not limited to a rectangular shape described above and can be variously modified. For example, a strip-like shape, an elliptical shape, or a shape that is partially collapsed in a width direction can be adopted.

Bonding Agent

A bonding agent which bonds the thermoelectric element 3 and the first and second electrodes 5 and 7 may be used. As the bonding agent, for example, solder which includes Au, Sn, Ag, Cu, Zn, Sb, Pb, In, or Bi, a brazing material which includes Ag, Cu, Zn, Ti, or Al, or a conductive adhesive which includes a Ag paste can be used. Particularly, solder which is relatively easily deformed is preferable. It is because heat stress caused by a large temperature difference between both sides of the thermoelectric module 1 can be mitigated and thus heat cycle resistance can be improved.

The thermoelectric module 1 according to the present embodiment can be variously modified as follows.

Figure 8:
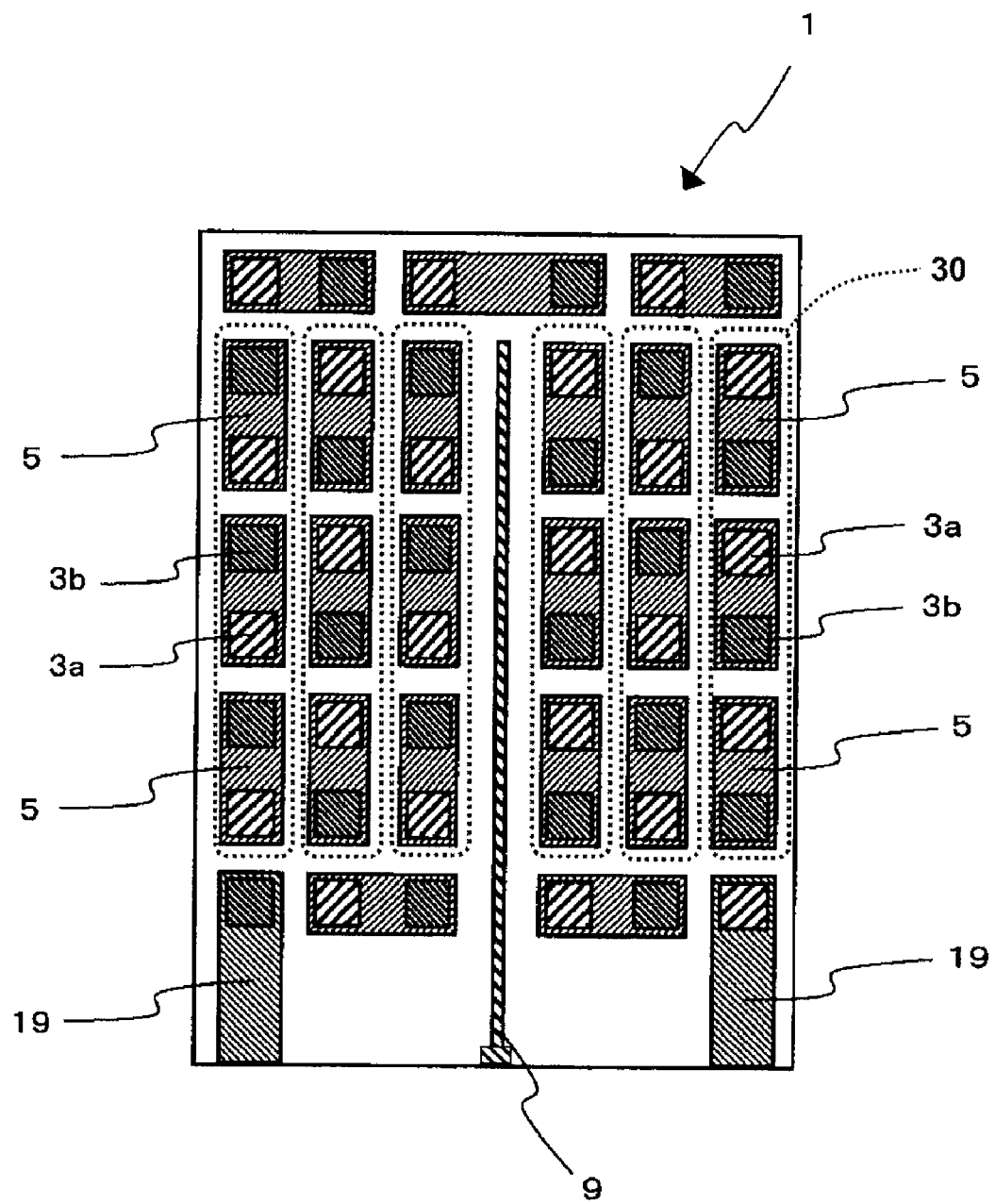
FIG. 8 is a cross-sectional view parallel to a base body surface illustrating a modification of a thermoelectric module shown in FIG. 1.

Firstly, if the ground electrode 9 extends to an edge portion of the base bodies 11a and 11b, as shown in FIG. 8, a portion corresponding to the edge portion may be wider than the other portions. In this instance, even if a leakage current flows to the ground electrode 9, a leakage current can be effectively conducted to an external portion of the base bodies 11a and 11b through an external terminal connected to the wide portion of the ground electrode 9 corresponding to the edge portion of the base bodies 11a and 11b.

Secondly, the ground electrode 9 may be embedded in a groove formed on a surface of the base bodies 11a and 11b. Even though condensation is generated between the thermoelectric elements 3 due to cooling, moisture generated due to condensation stays at the ground electrode 9 embedded in the groove, thereby preventing moisture from spreading over between the adjacent thermoelectric elements 3. Accordingly, an electrical short circuit between the thermoelectric elements 3 can be better prevented.

Thirdly, the ground electrode 9 may be embedded in a bank-shaped portion formed on the surface of the base bodies 11a and 11b and of a convex shape in the longitudinal cross section. In this instance, even though condensation is generated between the thermoelectric elements 3 due to cooling, moisture generated due to condensation is blocked by the bank-shaped portion of the ground electrode 9, thereby preventing or limiting moisture spreading over between the adjacent thermoelectric elements 3. Accordingly, the risk of an electrical short circuit between the thermoelectric elements 3 can be reduced or prevented.

Fourthly, a surface of the ground electrode 9 may be covered with water-repellent resin. In this instance, even though condensation is generated between the thermoelectric elements 3 due to cooling, moisture generated due to condensation is blocked by the water-repellent resin on the surface of the ground electrode 9, thereby preventing or limiting moisture from spreading over between the adjacent thermoelectric elements 3. Accordingly, the risk of an electrical short circuit between the thermoelectric elements 3 can be reduced or prevented.

Second Embodiment

Figure 3:
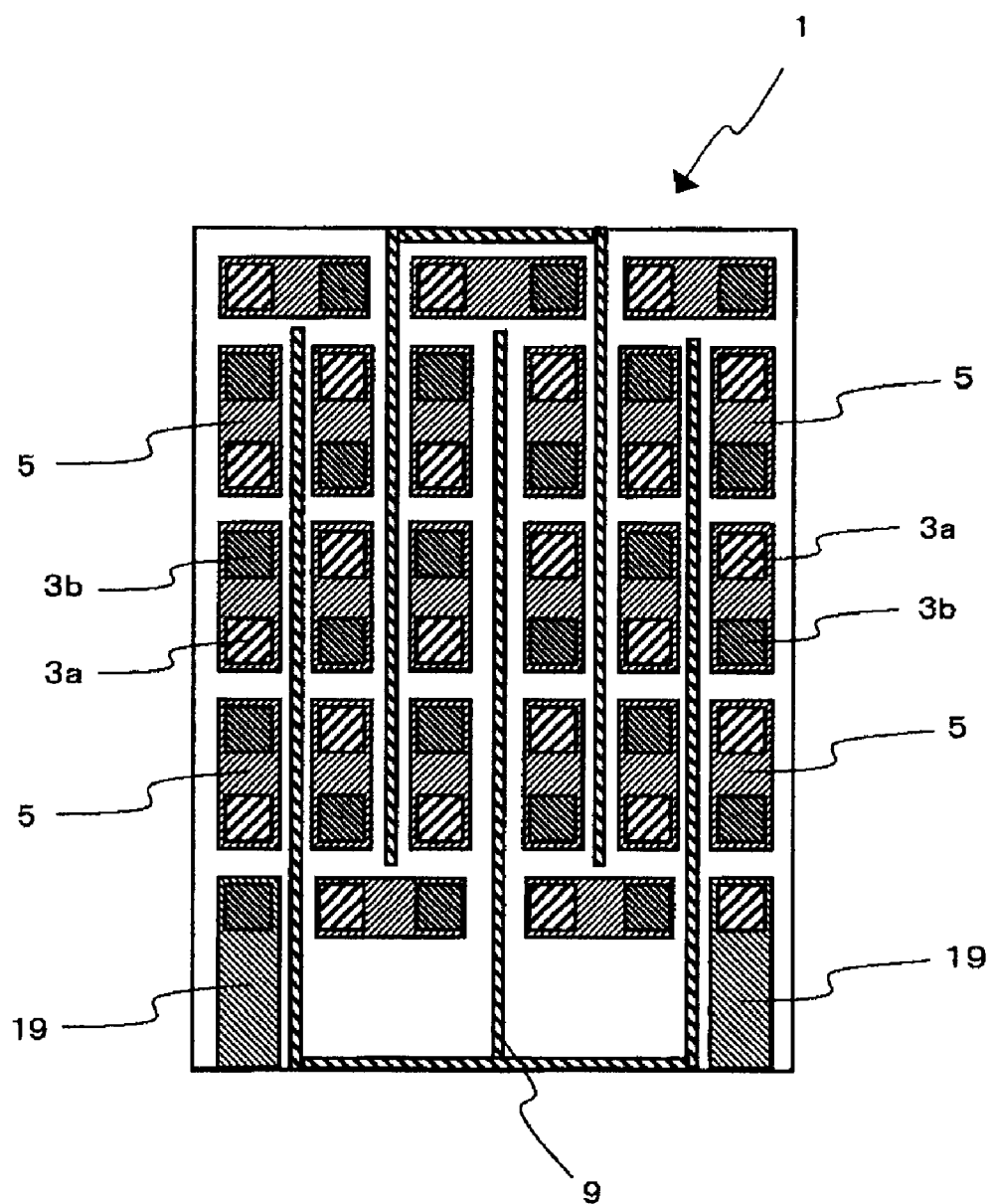
FIG. 3 is a cross-sectional view parallel to a base body surface of a thermoelectric module according to a second embodiment.
Figure 4:
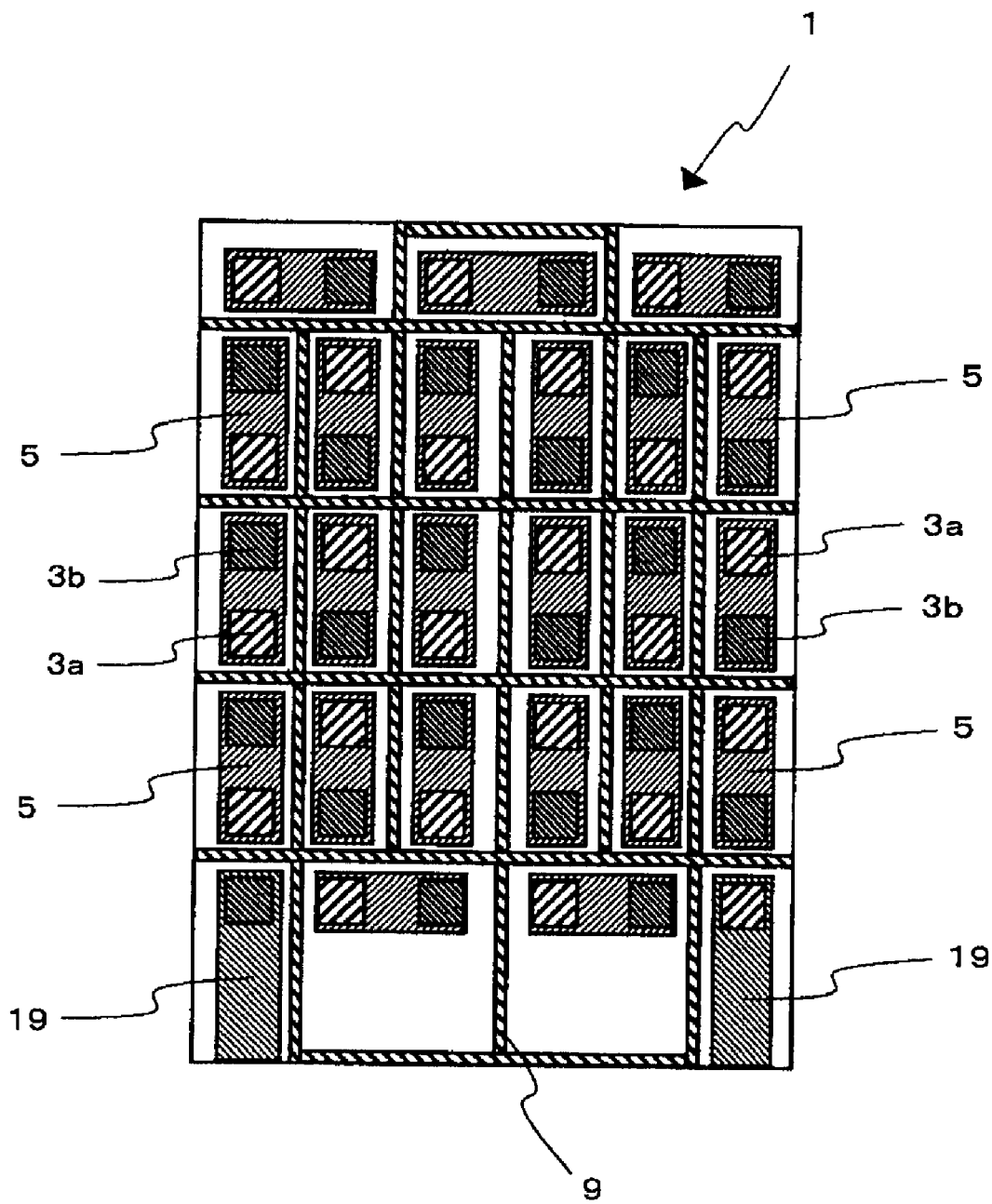
FIG. 4 is a cross-sectional view parallel to a base body surface of a thermoelectric module according to a modification of the second embodiment.

FIG. 3 shows a thermoelectric module according to a second embodiment, while FIG. 4 shows a modification of the embodiment of FIG. 3. Differences between this embodiment and the first embodiment described above are described below, and like reference numerals denote like components, and the description of these like components is not repeated.

In the thermoelectric module 1 according to the present embodiment, the ground electrode 9 is formed in a plurality of longitudinally extending portions which are parallel to a circuit of the thermoelectric module 1 and extend between each pair of adjacent columns. Therefore, compared to the first embodiment, an occurrence of an electrical short circuit can be better suppressed.

In the modification of FIG. 4, the ground electrode 9 extends longitudinally between all of the adjacent columns of first electrodes 5 as well as transversely between adjacent electrodes in each column. An occurrence of an electrical short circuit can be better suppressed compared to the embodiment shown in FIG. 3.

Third Embodiment

Figure 5:
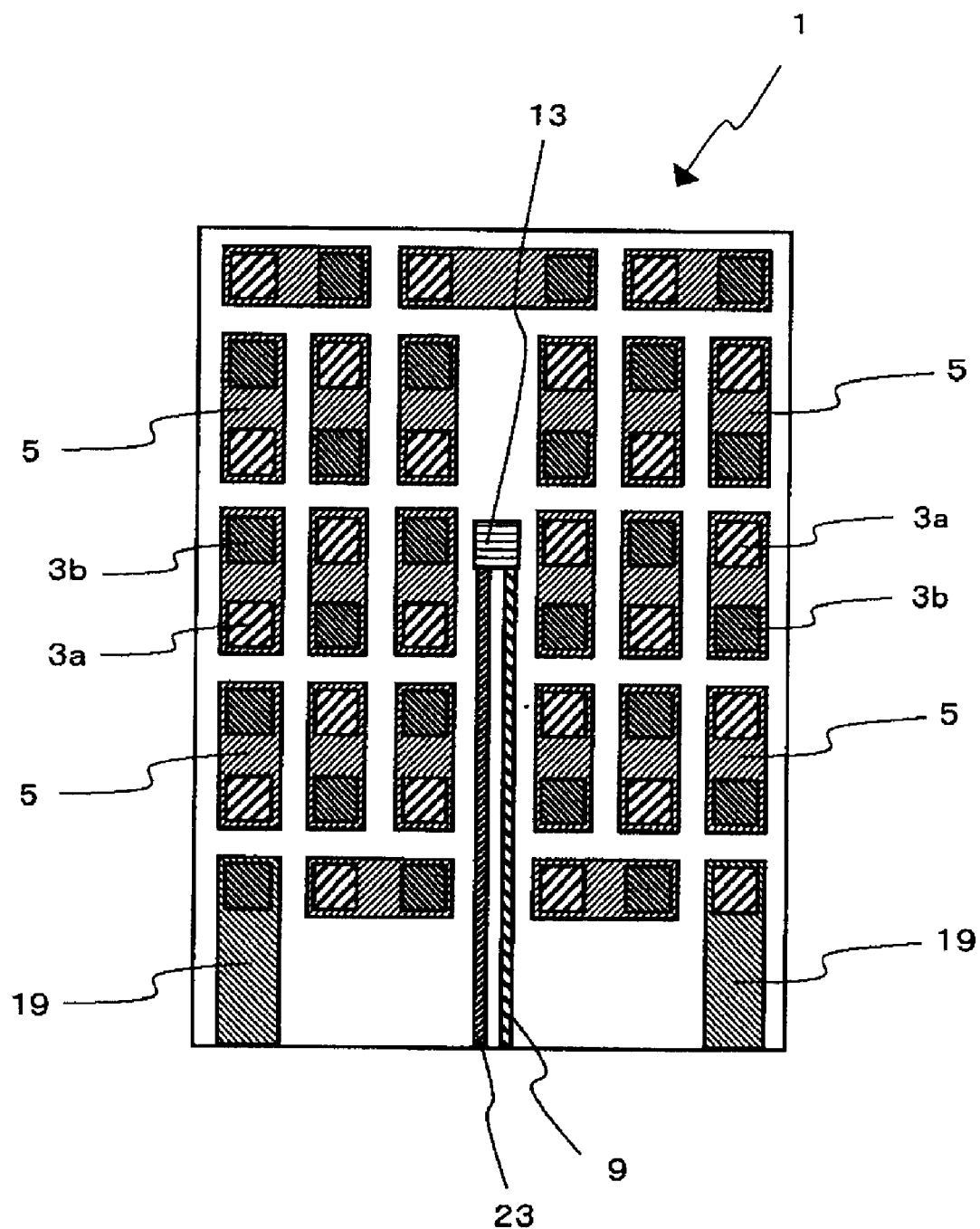
FIG. 5 is a cross-sectional view parallel to a base body surface of a thermoelectric module according to a third embodiment.
Figure 6:
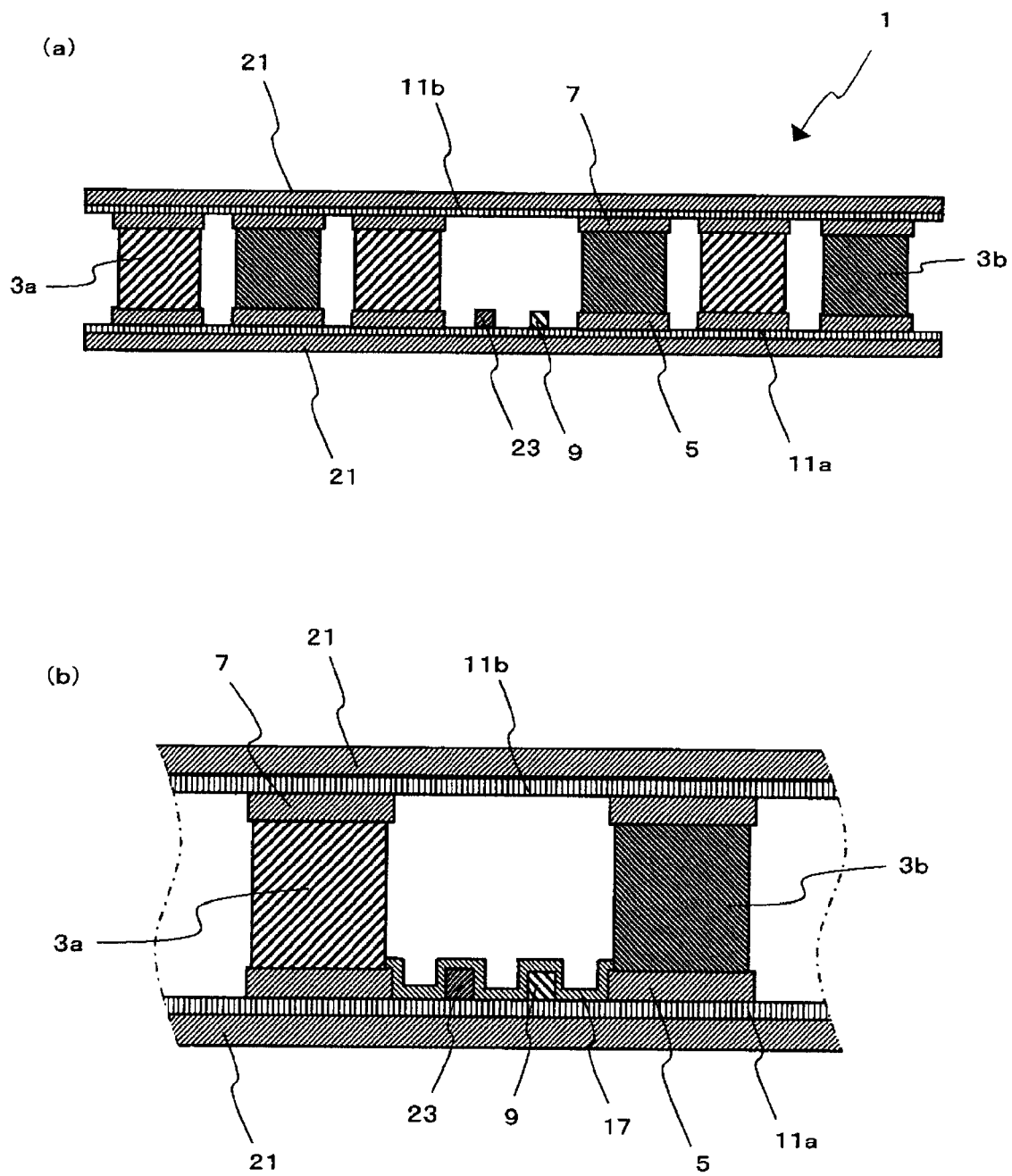
FIG. 6A is a cross-sectional view vertical to a base body surface of the thermoelectric module shown in FIG. 5.
FIG. 6B is an enlarged cross-sectional view illustrating a portion where a ground electrode is disposed in FIG. 6A.

FIG. 5 and FIGS. 6A and 6B show a thermoelectric module according to a third embodiment. Differences between this embodiment and the first embodiment described above are described below, and like reference numerals denote like components, and the description of these like components is not repeated.

In addition to the first embodiment, the thermoelectric module 1 according to the present embodiment further includes a thermistor 13 connected to the ground electrode 9. The ground electrode 9 can be used as a part of a circuit 23 of the thermistor 13, and degradation of the measurement accuracy of the thermistor 13 can be prevented or reduced even when a leakage current is generated.

Also, as shown in FIG. 6B, the ground electrode 9 can be coated with a coating agent 17. Thus, degradation of the ground electrode 9 can be suppressed, and the ground electrode 9 can be used as stable earth even with a long time use of the thermoelectric module 1.

The coating agent 17 can be made of an insulating material. For example, the coating agent 17 can be made of alumina ceramics, aluminum nitride ceramics, glass ceramics, or resin. Particularly, by using resin having a high elastic modulus, the coating agent 17 follows relative to expansion or contraction of the base body 11a, thereby stress concentration on the coating agent 17 can be prevented. Also, it is more effective to use heat-resistant plastic such as epoxy resin. Since epoxy resin is excellent in moisture resistance, a possibility that the ground electrode 9 is altered by ambient air can be reduced.

Furthermore, the coating agent 17 may be of the same material as the base body 11a, so that a bonding property between the coating agent 17 and the base body 11a can be increased. Therefore, a possibility that the coating agent 17 is peeled from the base body 11a to expose the ground electrode 9 can be reduced. Since both have the same thermal expansion coefficient, it is possible to prevent or reduce stress concentration on a bonding surface between the coating agent 17 and the base body 11a when the thermoelectric module 1 is energized.

Fourth Embodiment

Figure 7:
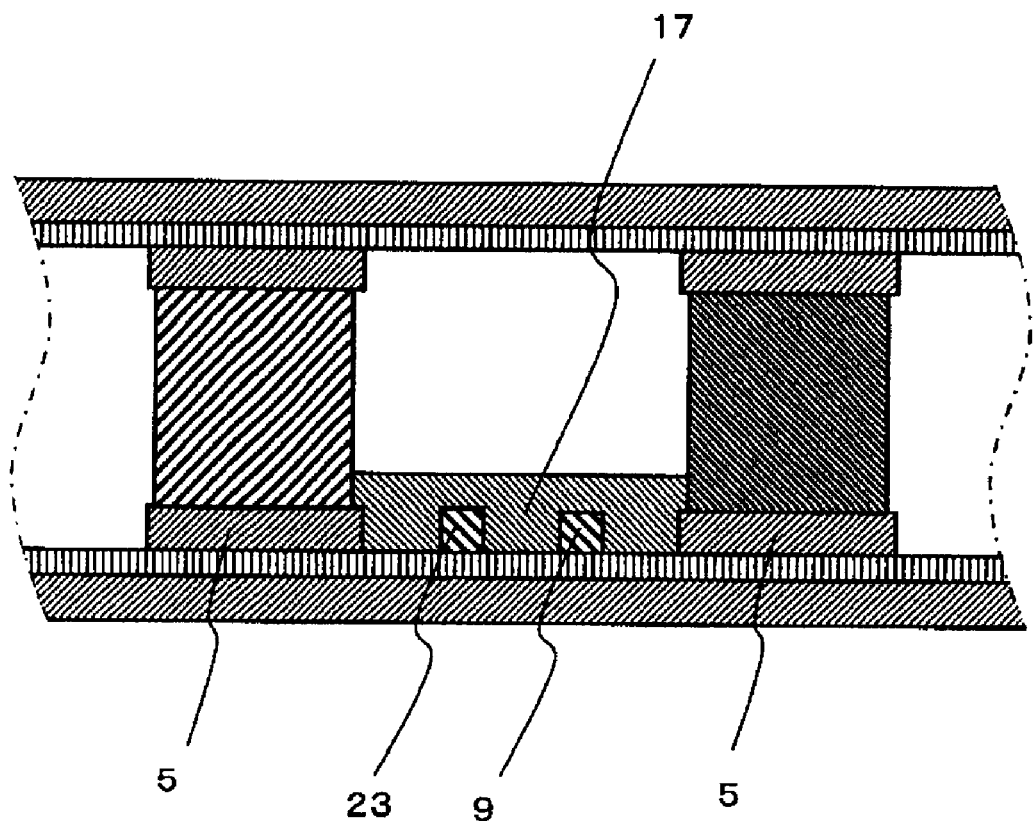
FIG. 7 is an enlarged cross-sectional view vertical to a base body surface of a thermoelectric module according to a fourth embodiment and illustrating a portion where a ground electrode is disposed.

FIG. 7 shows a thermoelectric module according to a fourth embodiment. Differences between this embodiment and the first embodiment described above are described below, and like reference numerals denote like components, and the description of these like components is not repeated.

In the thermoelectric module 1 according to the present embodiment, an insulating agent (coating agent 17) is filled up between the ground electrode 9 and the first electrode 5. Therefore, it is possible to further reduce the risk of a leakage current from occurring between the ground electrode 9 and the first electrode 5. Even if electrical insulation of the coating agent 17 is lowered, there is the above-described effect of inducing a leakage current to flow to the ground electrode 9, and thus degradation of thermoelectric characteristics can be effectively limited or prevented even with a long time use of the thermoelectric module 1.

Hereinbefore, some embodiments of the present invention have been described, but the present invention is not limited to the above-described embodiments and can be variously modified without departing from the scope of the present invention. For example, in the above embodiments, the thermoelectric module 3 has a square pole shape but can have a polygonal column shape or a cylindrical column shape.

Example 1

In one example, a thermoelectric module was made in the following manner. An N-type thermoelectric material which includes Bi, Te and Se and a P-type melting material which includes Bi, Sb and Te were melted, respectively, and were solidified in one direction by a Bridgman method to thereby prepare N-type and P-type materials of a rod-like shape that have the diameter of a longitudinal cross section of 0.8 mm. The N-type and P-type materials were cut to the thickness of 1.5 mm by a wire saw; thereby N-type and p-type thermoelectric elements were obtained.

The N-type and P-type thermoelectric elements were electrolytic plated to form a nickel layer on a cut surface and to dispose an Au layer thereon. A substrate (size 12 mm×12 mm) on which Copper having the thickness 105 μm was wired as a wiring conductor was prepared as a base body. A solder paste of 80Au-20Sn (80 mass % Au-20 mass % Sn) was coated on the wiring conductor using a metal mask. Twenty-four pairs of N-type and P-type thermoelectric elements have been electrically serially disposed on the solder paste. A solder paste of 80Au-20Sn was coated on another wiring conductor using a metal mask. Subsequently, the N-type and P-type thermoelectric elements arranged as described above were interposed between two substrates. Heating treatment was performed in a reflow furnace while applying stress (pressure) to the top and bottom surfaces of the two substrates. Finally, a support substrate was connected to a heat exchanger by a connecting member, thereby completing the thermoelectric module.

In sample no. 1, the ground electrode 9 was not provided, and in sample nos. 2 to 4, the ground electrodes 9 shown in FIGS. 2 to 4 were formed, respectively. In sample no. 5, the thermistor shown in FIG. 5 was connected. The line width of the ground electrode was 0.3 mm, and the surface of the ground electrode 9 was coated with epoxy resin.

An energization test of the thermoelectric module made by the above-described manner was performed. As the energization test of the thermoelectric module, a resistance value of the thermoelectric module was measured when a voltage of a frequency 1 kHz was applied. Then, the thermoelectric module was driven by applying a DC voltage of 2V in a constant-temperature bath at −20° C. Further, the thermoelectric module was driven by applying a DC voltage of 2V at 25° C. Condensation was forcibly generated.

The thermoelectric module in which condensation was generated was driven by applying a DC voltage of 2V. Thereafter, the resistance value of the thermoelectric module was measured again when a voltage of a frequency 1 kHz was applied.

The result is shown in Table 1 below.

TABLE 1

| Sample No. | Type | Module resistance before condensation (Ω) | Module resistance after condensation (Ω) | Change rate (%) |
| --- | --- | --- | --- | --- |
| 1 | — | 1.41 | 0.95 | 32.6 |
| 2 | FIG. 2 | 1.37 | 1.34 | 2.2 |
| 3 | FIG. 3 | 1.45 | 1.43 | 1.4 |
| 4 | FIG. 4 | 1.47 | 1.46 | 0.7 |
| 5 | FIG. 5 | 1.43 | 1.39 | 2.8 |

In the thermoelectric module of sample no. 1, since the ground electrode was not provided, an electric short circuit occurred between some of the thermoelectric elements, so that the resistance value of the thermoelectric module changed. After measurement, the thermoelectric module of sample no. 1 was disassembled and observed. A discolored portion which indicates an electrical short circuit occurring between the adjacent first electrodes was found between the electrodes. It was found that 8 pairs of thermoelectric elements were skipped over and not connected for this reason.

Meanwhile, in the thermoelectric modules of sample nos. 2 to 5, since the ground electrode was provided, an electrical short circuit between the thermoelectric elements was prevented. Therefore, resistance values of the thermoelectric modules hardly changed.

As a result of measuring the temperature of the thermoelectric module using the thermistor of sample no. 5, the same temperature as the constant-temperature bath was measured, and so it was confirmed that the temperature has been accurately measured.

Example 2

Further, in this example, moisture generated due to condensation was completely removed from the thermoelectric modules of sample nos. 2 to 5 by drying at 80° C. for one hour using an air dryer. Each thermoelectric module was driven by applying a DC voltage of 2V in a constant-temperature bath for 100 hours at 25° C. Then, a resistance value of each thermoelectric module was measured again when an AC voltage of a frequency 1 kHz was applied.

The result is shown in Table 2 below

TABLE 2

| Sample No. | Type | Module resistance before condensation (Ω) | Module resistance after drying (Ω) | Change rate (%) |
| --- | --- | --- | --- | --- |
| 2 | FIG. 2 | 1.37 | 1.37 | 0 |
| 3 | FIG. 3 | 1.45 | 1.45 | 0 |
| 4 | FIG. 4 | 1.47 | 1.47 | 0 |
| 5 | FIG. 5 | 1.43 | 1.43 | 0 |

As can be seen in Table 2, in the thermoelectric modules of sample nos. 2 to 5, since moisture generated on a surface due to condensation was completely removed, a leakage current due to moisture was prevented, and a module resistance value before condensation was measured.

As described in the above examples, the thermoelectric module having a ground electrode is shown to have stable characteristics so that the risk of a short circuit between the thermoelectric elements can be reduced or prevented under an environment in which condensation is generated, and the resistance value does not change even with continuous driving.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The invention claimed is:

1. A thermoelectric module, comprising:
   a first substrate;
   a second substrate comprising a second surface which is apart from and faces a first surface of the first substrate;
   a plurality of thermoelectric elements arranged on the first surface and the second surface;
   a plurality of first electrodes on the first surface and the second surface, each electrode being electrically connected to at least one of the plurality of thermoelectric elements; and
   a second ground electrode on at least the first surface, electrically isolated from the plurality of first electrodes and not in direct contact with said plurality of first electrodes;
   wherein at least some of the first electrodes on the first surface are arranged in a plurality of columns each of which comprises two or more first electrodes aligned in a longitudinal direction; and
   the ground electrode extends at least along the first surface longitudinally between three or more adjacent columns and transversely between three or more pairs of adjacent first electrodes in the columns.

2. The thermoelectric module according to claim 1, wherein the second ground electrode extends longitudinally between the two adjacent columns.

3. The thermoelectric module according to claim 1, further comprising a cover material covering at least part of the second ground electrode.

4. The thermoelectric module according to claim 3, wherein the cover material is filled at a certain thickness in a facing area in which the adjacent two columns face each other.

5. The thermoelectric module according to claim 1, wherein the plurality of thermoelectric elements comprises a plurality of P-type thermoelectric elements and a plurality of N-type thermoelectric elements.

6. The thermoelectric module according to claim 5, wherein each of the plurality of first electrodes is connected to a respective one of the plurality of P-type thermoelectric elements and a respective one of the plurality of N-type thermoelectric elements so that the plurality of first electrodes electrically connect in series the plurality of P-type thermoelectric elements and the plurality of N-type thermoelectric elements.

7. The thermoelectric module according to claim 6, wherein each of the plurality first of electrodes is elongate and has opposite first and second end portions, and is connected to a respective one of the plurality of P-type thermoelectric elements at the first end portion and is connected to a respective one of the plurality of N-type thermoelectric elements at the second end portion.

8. The thermoelectric module according to claim 5, wherein the second ground electrode is located between one of the plurality of P-type thermoelectric elements and one of the plurality of N-type thermoelectric elements which are adjacent to each other.

9. The thermoelectric module according to claim 1, wherein an energizing direction of the second ground electrode is parallel to an energizing direction of an electrode among the plurality of first electrodes which is adjacent to the second ground electrode.

10. The thermoelectric module according to claim 1, further comprising a thermistor electrically connected to the second ground electrode.

11. The thermoelectric module according to claim 10, wherein the thermistor is located on at least one of the first surface and the second surface.

12. The thermoelectric module according to claim 11, wherein the thermistor is located between the adjacent two columns among the plurality of columns.

13. The thermoelectric module according to claim 1, wherein each of the plurality of first electrodes has a rectangular shape.

14. The thermoelectric module according to claim 1, wherein at least some of the first electrodes on the second surface are arranged in a plurality of columns, each column on the second surface comprising two or more electrodes aligned in a longitudinal direction, and the second ground electrode is located between two adjacent columns on the second surface.

15. A thermoelectric module, comprising:
a first substrate having front edge and a rear edge;
a second substrate comprising a second surface which is apart from and faces a first surface of the first substrate;
a plurality of thermoelectric elements arranged on the first surface and the second surface;
a plurality of first electrodes on the first surface and the second surface, each first electrode being electrically connected to at least one of the plurality of thermoelectric elements; and
more than one second ground electrode on at least the first surface, electrically isolated from the plurality of first electrodes and not in direct contact with said plurality of first electrodes;
wherein at least some of the first electrodes on the first surface are arranged in a plurality of columns each of which comprises two or more electrodes aligned in a longitudinal direction; and
the more than one second ground electrode separate and extending at least along the first surface both from the front edge towards the rear edge and from the rear edge towards the front edge.

16. The thermoelectric module according to claim 15, wherein the more than one second ground electrodes include perpendicular and parallel portions.

* * * * *